(12) United States Patent
Chien

(10) Patent No.: US 12,613,158 B2
(45) Date of Patent: Apr. 28, 2026

(54) LEAK DETECTION COMPONENT FOR A LIQUID COOLING SYSTEM

(71) Applicant: DELL PRODUCTS L.P., Round Rock, TX (US)

(72) Inventor: Tung-Yu Chien, Zhonhe District (TW)

(73) Assignee: Dell Products L.P., Round Rock, TX (US)

( * ) Notice: Subject to any disclaimer, the term of this patent is extended or adjusted under 35 U.S.C. 154(b) by 404 days.

(21) Appl. No.: 18/363,907

(22) Filed: Aug. 2, 2023

(65) Prior Publication Data

US 2025/0044179 A1 Feb. 6, 2025

(51) Int. Cl.
| | |
|---|---|
| *G01M 3/16* | (2006.01) |
| *G01M 3/04* | (2006.01) |
| *G01M 3/18* | (2006.01) |
| *H05K 7/20* | (2006.01) |

(52) U.S. Cl.
CPC .............. *G01M 3/165* (2013.01); *G01M 3/04* (2013.01); *G01M 3/18* (2013.01); *H05K 7/20818* (2013.01)

(58) Field of Classification Search
CPC .......... G01M 3/165; G01M 3/04; G01M 3/18; H05K 7/20818
USPC ...................................................... 73/40.5 R
See application file for complete search history.

(56) References Cited

U.S. PATENT DOCUMENTS

| | | | | |
|---|---|---|---|---|
| 6,259,370 | B1 * | 7/2001 | Takenoshita | ............ G01M 3/28 250/577 |
| 10,143,114 | B2 | 11/2018 | Shelnutt et al. | |
| 11,346,741 | B2 | 5/2022 | Curtis et al. | |
| 11,802,807 | B2 * | 10/2023 | Li | ............ G06F 1/206 |
| 11,815,428 | B1 * | 11/2023 | Varrey | .............. G01M 3/18 |
| 2003/0110834 | A1 * | 6/2003 | Weber | ............. G01M 3/2807 73/40 |
| 2004/0160741 | A1 * | 8/2004 | Moss | ............. H05K 7/20009 361/679.48 |
| 2011/0291845 | A1 * | 12/2011 | Rice | ............ G08B 21/20 340/605 |
| 2017/0181323 | A1 * | 6/2017 | Shelnutt | ............ H05K 7/20772 |
| 2017/0181324 | A1 * | 6/2017 | Shelnutt | ............ H05K 7/20781 |
| 2017/0181327 | A1 * | 6/2017 | Shelnutt | ............ H05K 7/20781 |
| 2017/0181329 | A1 * | 6/2017 | Shelnutt | ............ H05K 7/20781 |
| 2018/0341301 | A1 * | 11/2018 | Shabbir | ............ G06F 1/206 |

(Continued)

FOREIGN PATENT DOCUMENTS

| | | | | | |
|---|---|---|---|---|---|
| CN | 115507310 | A | * 12/2022 | ......... | H05K 7/20781 |
| EP | 2058573 | B1 | * 12/2010 | .......... | G01M 3/2853 |

(Continued)

*Primary Examiner* — Stephanie E Bloss
*Assistant Examiner* — Kevin C Butler
(74) *Attorney, Agent, or Firm* — Larson Newman, LLP

(57) ABSTRACT

A liquid cooling leak detection system includes a sensor cable, a leak sensor cable carrier, and multiple cable carriers. The sensor cable indicates a detected leak based on the sensor cable being in contact with a liquid. The leak sensor cable carrier is in physical communication with the sensor cable. The cable carriers are in physical communication with the sensor cable and with the leak sensor cable carrier. Each of the cable carriers includes a support structure and an absorbent material. The absorbent material is in physical communication with the support structure and with the sensor cable. The absorbent material transfers the liquid from a portion of the absorbent material to the sensor cable.

18 Claims, 6 Drawing Sheets

(56)  References Cited

U.S. PATENT DOCUMENTS

| | | | | |
|---|---|---|---|---|
| 2020/0103307 A1* | 4/2020 | Farkas | ............... | H05K 7/20218 |
| 2020/0278269 A1* | 9/2020 | Rasmussen | ............ | G08B 21/20 |
| 2020/0348202 A1* | 11/2020 | Farkas | .................. | H05K 1/162 |
| 2020/0378858 A1* | 12/2020 | Curtis | ........................ | F17D 5/06 |
| 2021/0088404 A1* | 3/2021 | Li | ........................ | G06F 11/1441 |
| 2021/0320490 A1* | 10/2021 | Lin | .................... | H05K 7/20763 |
| 2021/0385970 A1* | 12/2021 | Su | ........................ | G01M 3/3263 |
| 2022/0113219 A1* | 4/2022 | Stumpf | .............. | H05K 7/20272 |
| 2022/0196507 A1* | 6/2022 | Subrahmanyam | ... | H05K 7/2079 |
| 2023/0297099 A1* | 9/2023 | Hu | .................... | G05B 23/0286 |
| | | | | 700/282 |
| 2023/0413474 A1* | 12/2023 | Clark | ................ | H05K 7/20281 |
| 2023/0413475 A1* | 12/2023 | Curtis | .................... | F16K 17/36 |
| 2025/0044179 A1* | 2/2025 | Chien | ................... | G01M 3/165 |
| 2025/0194057 A1* | 6/2025 | Farkas | .............. | H05K 7/20763 |
| 2025/0224303 A1* | 7/2025 | Castrigno | ........... | G01M 3/2876 |
| 2025/0338452 A1* | 10/2025 | Tunks | ............... | H05K 7/20272 |

FOREIGN PATENT DOCUMENTS

| | | | | | |
|---|---|---|---|---|---|
| KR | 20230174905 A | * | 12/2023 | ............. | G01D 11/30 |
| WO | WO-2014135978 A2 | * | 9/2014 | ............. | G06F 1/206 |

* cited by examiner

LEAK DETECTION COMPONENT FOR A LIQUID COOLING SYSTEM

FIELD OF THE DISCLOSURE

The present disclosure generally relates to information handling systems, and more particularly relates to a leak detection component for a liquid cooling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A liquid cooling leak detection system includes a sensor cable, a leak sensor cable carrier, and multiple cable carriers. The sensor cable may indicate a detected leak based on the sensor cable being in contact with a liquid. The leak sensor cable carrier is in physical communication with the sensor cable. The cable carriers are in physical communication with the sensor cable and with the leak sensor cable carrier. Each of the cable carriers includes a support structure and an absorbent material. The absorbent material is in physical communication with the support structure and with the sensor cable. The absorbent material may transfer the liquid from a portion of the absorbent material to the sensor cable.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
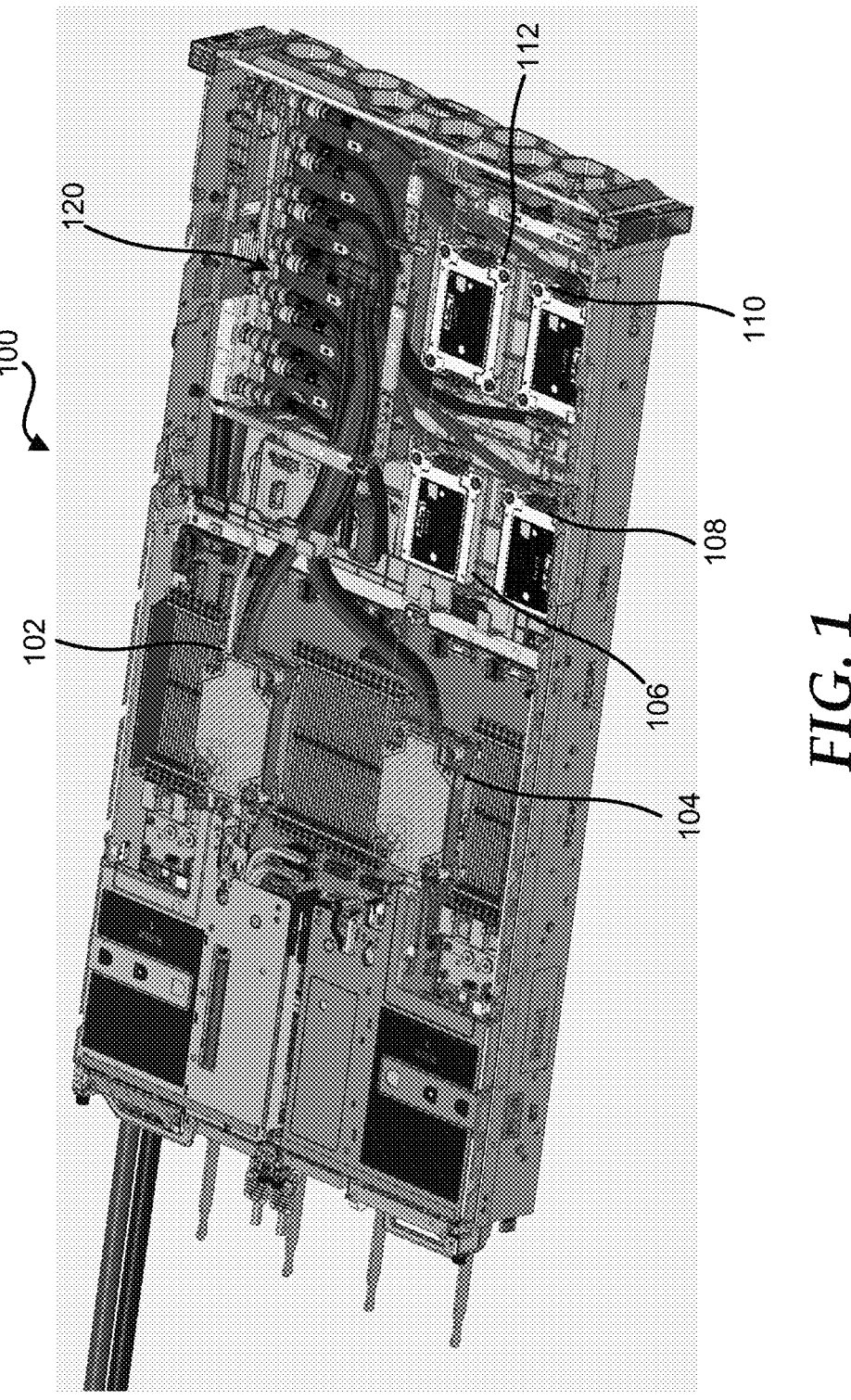
FIG. 1 is a perspective view of a planar module tray for an information handling system according to at least one embodiment of the present disclosure.

FIG. 1 illustrates a planar module tray 100 for an information handling system, such as information handling system 800 of FIG. 8, according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Planar module tray 100 includes processors 102 and 104, graphics processing units (GPUs) 106, 108, 110, and 112, and a liquid cooling system 120. In an example, liquid cooling system 120 may include a cooling liquid reservoir, multiple cooling pipes, and multiple cold plates. A different cold plate of liquid cooling system 120 may be in physical communication with a different one of processors 102 and 104 and GPUs 106, 108, 110, and 112. In an example, planar module tray 100 may be any suitable size such as a 2U chassis tray. Planar module tray 100 may include additional components without varying from the scope of this disclosure.

In certain examples, liquid cooling system 120 may provide a direct liquid cooling (DLC) solution for processors 102 and 104 and GPUs 106, 108, 110, and 112. For example, the cooling pipes may provide a cooling liquid to the cold plates and return heated cooling liquid from the cold plates back to the cooling liquid reservoir. In an example, the cooling liquid may leak from different locations in liquid cooling system 120, such as fitting joints between the cooling pipes and the cold plates. This cooling liquid leakage may cause the cooling liquid to spray within modular planar tray 100, over other trays within a chassis, or the like. The cooling liquid leakage may cause damage to other components in modular planar tray 100 or within an information handling system containing the module planar tray. Modular planar tray 100 and an associated information handling system may be improved by better leak detection.

Figure 2:
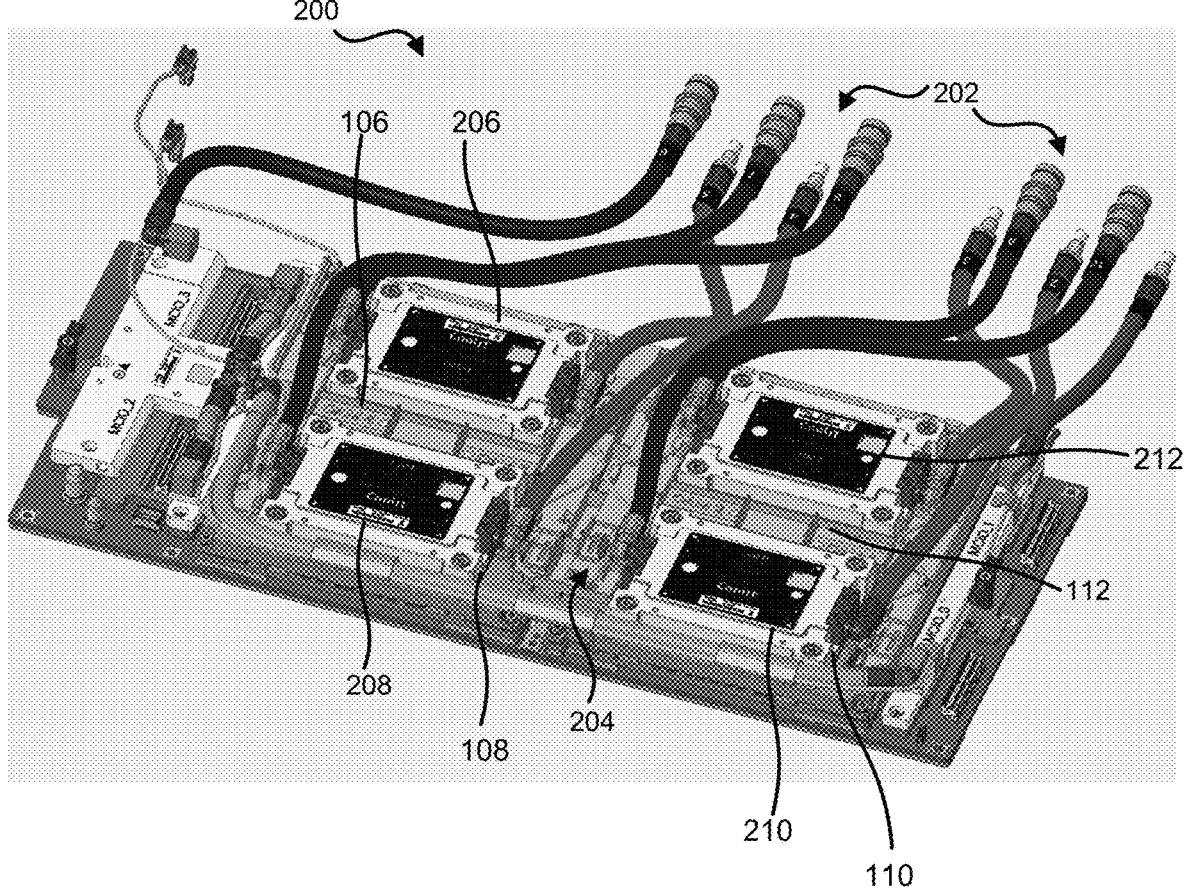
FIG. 2 is a perspective view of a graphics processing unit system with liquid cooling according to at least one embodiment of the present disclosure.

FIG. 2 illustrates a graphics processing unit system 200 including multiple cooling pipes 202, a liquid cooling leak detection system 204, and cold plates 206, 208, 210, and 212 according to at least one embodiment of the present disclosure. In an example, different cold plates 206, 208, 210, and 212 may be placed in physical communication with a different one of GPUs 106, 108, 110, and 112. Cooling pipes 202 may provide cooling liquid to each of cold plates 206, 208, 210, and 212, which in turn may provide cooling to respective GPUs 106, 108, 110, and 112. Components of liquid cooling leak detection system 204 may determine whether a cooling liquid leakage has occurred within the graphics processing unit system 200. The components of liquid cooling leak detection system 204 will be described with respect to FIGS. 3-7 below.

Figure 3:
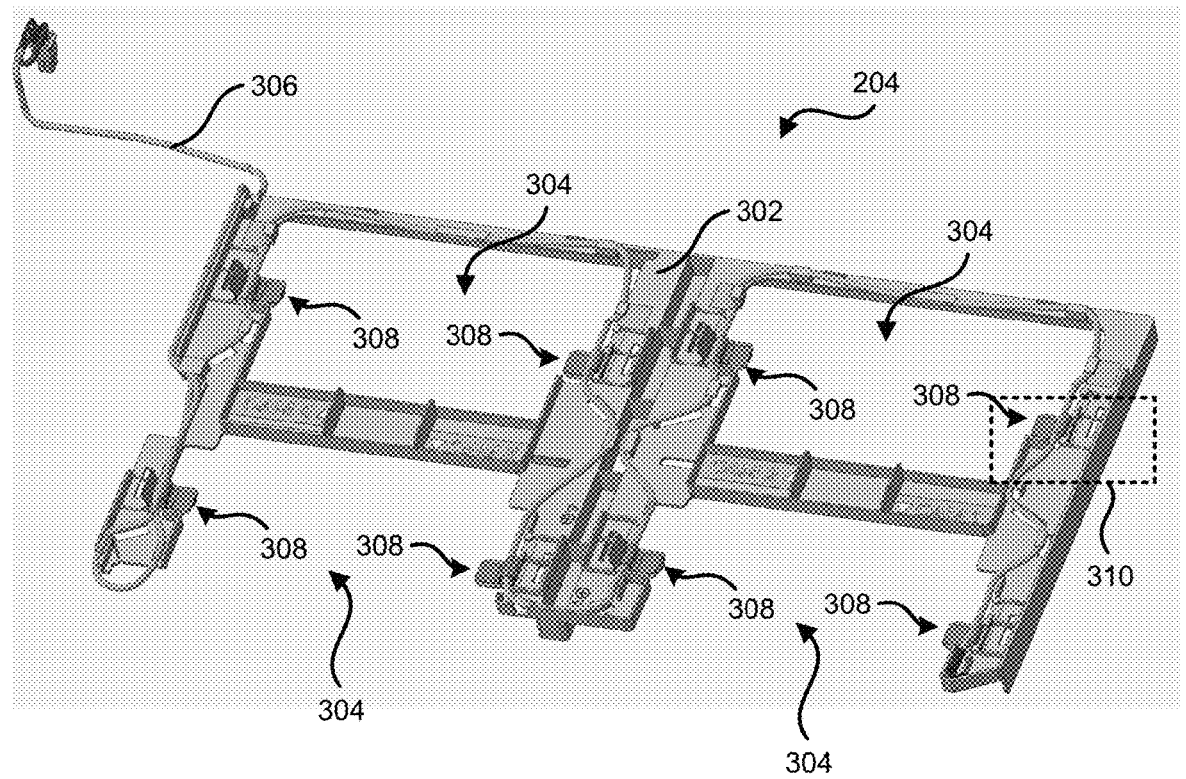
FIG. 3 is a liquid cooling leak detection system according to at least one embodiment of the present disclosure.

FIG. 3 illustrates liquid cooling leak detection system 204 according to at least one embodiment of the present disclosure. Liquid cooling leak detection system 204 includes a leak sensor cable carrier 302, which in turn includes multiple locations/openings 304 for cold plates and GPUs to be inserted. Liquid cooling leak detection system 204 also includes a sensor wire 306 and multiple cable carriers 308. Liquid cooling leak detection system 204 may include additional components without varying from the scope of this disclosure.

In an example, sensor cable 306 may be routed along leak sensor cable carrier 302 and securely mounted at any number of suitable locations. For example, leak sensor cable 306 may be held under different hooks that extend up from leak sensor cable carrier 302. Leak sensor cable 306 may be attached to each of cable carriers 308 to enable proper leak detection. In an example, the resistance of sensor cable 306 may change when a liquid comes in contact with the sensor cable. This change in resistance may be detected by a processor of an information handling system, such as processor 802 of information handling system 800 in FIG. 8. Based on the detected change in resistance, the processor may determine that a cooling liquid leak has occurred within planar module tray 100. The processor may provide a leak alert to an individual associated with the planar module tray 100 via any suitable manner including, but not limited to, a light emitting diode (LED), an electronic mail message, and a sound. The LED may blink, change colors, or the like to indicate the leak detection. The sound may include, but is not limited to, a beeping sounds and a continuous sound.

In certain examples, cable carriers 308 and corresponding locations of sensor cable 306 may transition from an engaged position to a disengaged position as will be described below with respect to FIGS. 5 and 6. In an example, sensor cable 306 may be able to move or transition between these positions without separating from other portions of leak sensor cable carrier 302. In another example, sensor cable 306 may not move while cable carriers 308 transition between the engaged and disengaged positions. A portion 310 of liquid cooling leak detection system 204 will be described with respect to FIG. 4.

Figure 4:
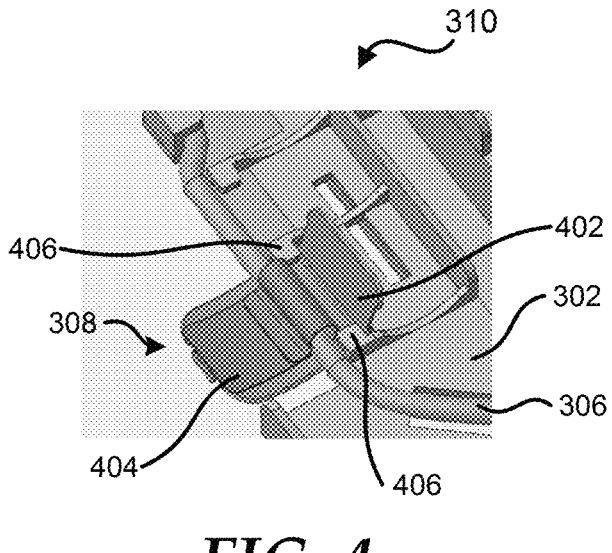
FIG. 4 is a perspective view of a portion of a liquid cooling leak detection system with a cable carrier according to at least one embodiment of the present disclosure.

FIG. 4 illustrates portion 310 of liquid cooling leak detection system 204 according to at least one embodiment of the present disclosure. Cable carrier 308 includes a support structure 402 and an absorbent material 404. Support structure 402 may be held in physical communication with leak sensor cable carrier 302 via tabs 406. Absorbent material 404 may be in physical communication with support structure 402 and with sensor cable 306. In an example, absorbent material 404 may be wrapped around sensor cable 306 such that any liquid that comes in contact with the absorbent material may be transferred to the sensor cable. A portion of absorbent material 404 may be securely mounted to support structure 402, such that the absorbent material may move with the support structure.

Figure 5:
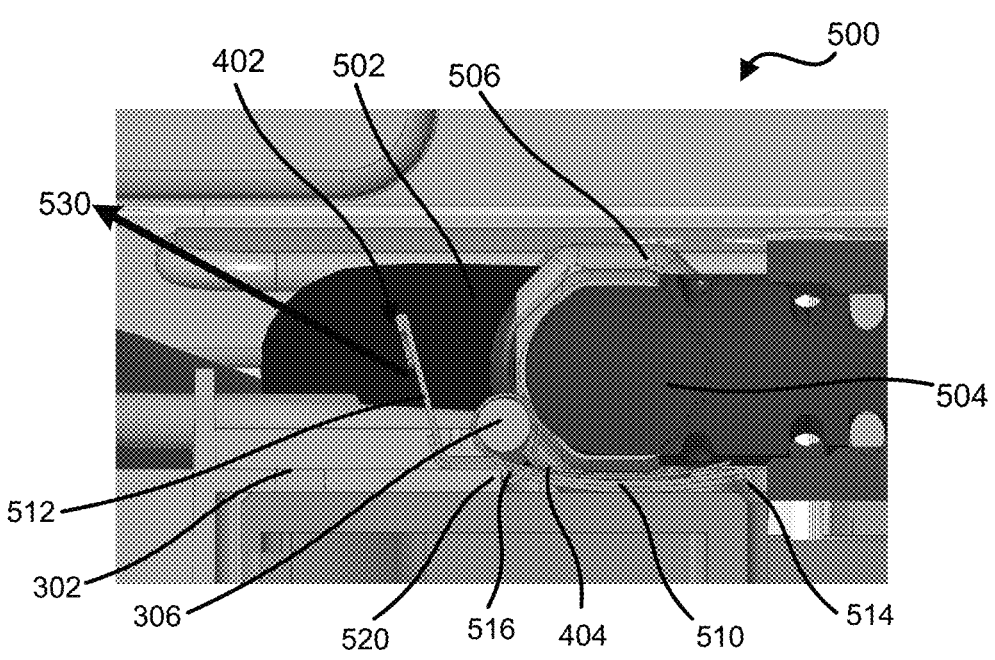
FIGS. 5 and 6 are side views of liquid cooling pipe components and a cable carrier according to at least one embodiment of the present disclosure.
Figure 6:
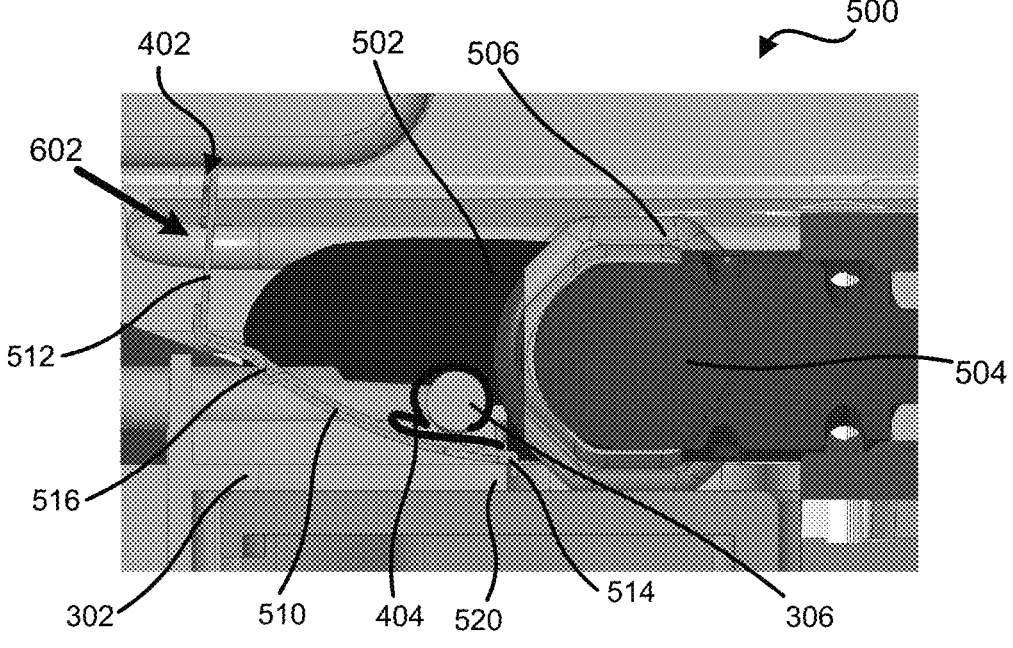

FIGS. 5 and 6 illustrate a portion 500 of a graphics processing unit system including a cooling pipe 502, a coupler 504, and a cold plate fitting 506 according to at least one embodiment of the present disclosure. Support structure 402 includes a base 510, a back 512, a bending tab 514, and a bump 516. Leak sensor cable carrier 302 includes an edge or lip 520 to interface with bending tab 514 and bump 516 of support structure 402. In an example, portion 500 of a graphics processing unit system may be part of graphics processing unit system 200 in FIG. 2.

Referring to FIG. 5, support structure 402 is in an engaged position under cold plate fitting 506 and coupler 504. In certain examples, while support structure 402 is in the engaged position, bump 520 on base 510 may be in physical communication with edge/lip 520 of leak sensor cable carrier 302. In this situation, bump 520 may hold support structure 402 in the engaged position. While in the engaged position, absorbent material 404 may be in physical communication with cold plate fitting 506. When a leak occurs at any spot around the interface between cooling pipe 502 and coupler 504, cold plate fitting 506 may provide the liquid to absorbent material 404. The liquid may then be provided to sensor cable 306, which in turn may provide an indication of the leak to a processor of an information handling system.

In an example, base 510 may be curved in a concave direction with respect to cold plate fitting 506. The concave curve of base 510 may place bending tab 514 above a portion of leak sensor cable carrier 302 while support structure 402 is in the engaged position, which may enable the support structure to transition from the engaged position to the disengaged position. A force may be exerted on back 512 in the direction of arrow 530, and this force may cause support structure 402 to move or transition from the engaged position to the disengaged position. In an example, the force in the direction of arrow 530 may be greater than a force of the interface between edge/lip 520 and bump 520.

Referring to FIG. 6, support structure 402 is in the disengaged position and base 510 is not under coupler 504 or cold plate fitting 506. When support structure 402 is in the disengaged position, bending tab 514 may be in physical communication with edge/lip 520 of leak sensor cable carrier 302. In this situation, bending tab 514 may catch on edge/lip 520 to prevent support structure from being pulled completely out of leak sensor cable carrier 302. As support structure 402 transitions from the engaged position to the disengaged position, some of absorbent material 404 may fold or roll over itself as the support structure is pulled beyond sensor cable 306.

When support structure 402 is in the disengaged position, the entire leak sensor cable carrier 302 may be removed from an information handling system with interface from a corresponding cold plate or a corresponding GPU. In an example, a force may be exerted on back 512 in the direction of arrow 602, and this force may cause support structure 402 to move or transition from the disengaged position to the engaged position. During the transition from the disengaged position to the engaged position, bump 516 may snap fit past edge/lip 520 of leak sensor cable carrier 302.

Figure 7:
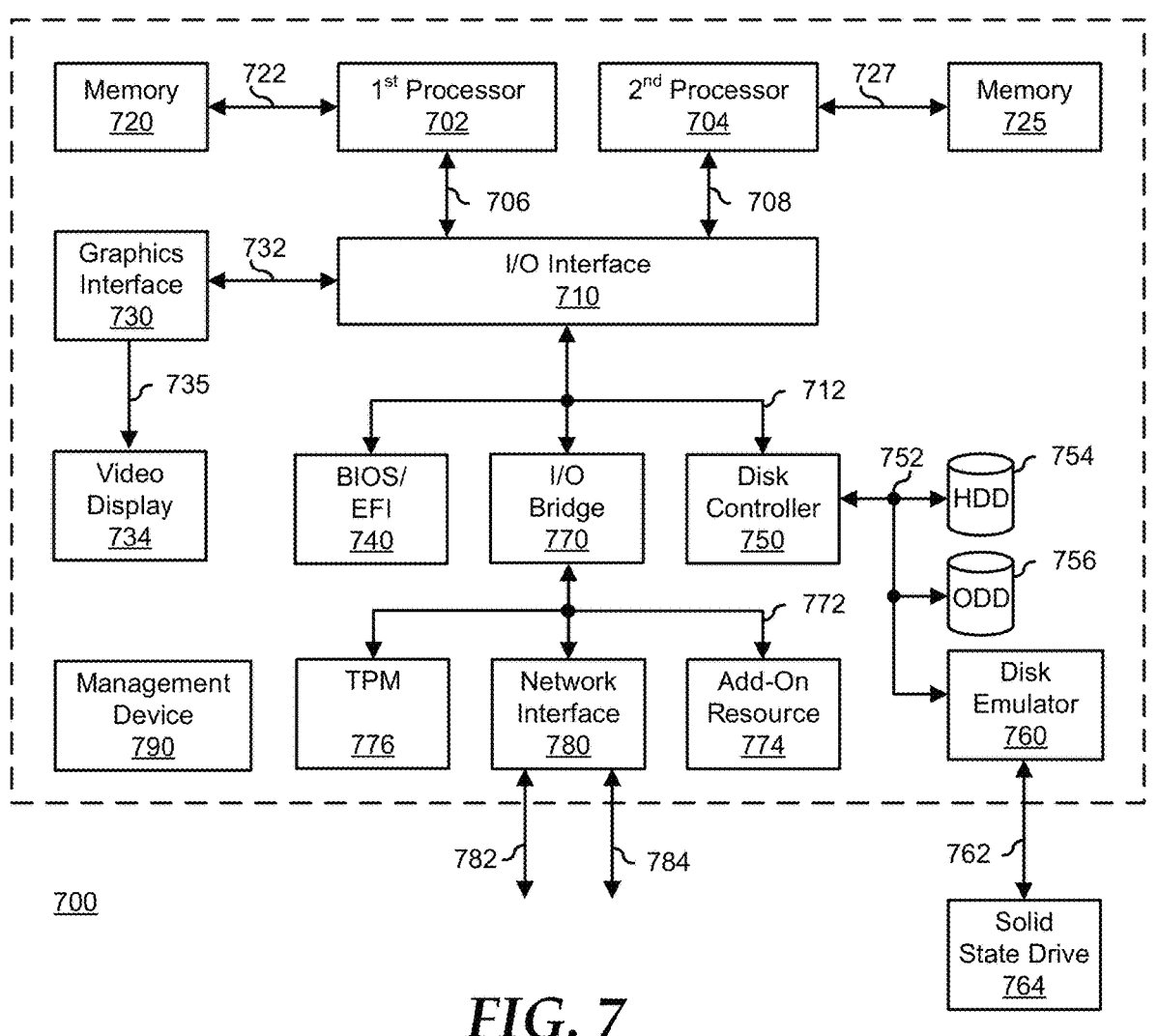
FIG. 7 is a block diagram of a general information handling system according to an embodiment of the present disclosure.

FIG. 7 shows a generalized embodiment of an information handling system 700 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below and operates to perform one or more of the methods described below. Information handling system 700 includes a processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an I/O bridge 770, one or more add-on resources 774, a trusted platform module (TPM) 776, a network interface 780, a management device 790, and a power supply 795. Processors 702 and 704, I/O interface 710, memory 720, graphics interface 730, BIOS/UEFI module 740, disk controller 750, HDD 754, ODD 756, disk emulator 760, SSD 762, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732 and provides a video display output 736 to a video display 734. In a particular embodiment, information handling system 700 includes separate memories that are dedicated to each of processors 702 and 704 via separate memory interfaces. An example of memories 720 and 730 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 7394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712 or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700.

Management device 790 can operate off of a separate power plane from the components of the host environment so that the management device receives power to manage information handling system 700 when the information handling system is otherwise shut down. An example of management device 790 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 790 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A liquid cooling leak detection system comprising:
   a sensor cable to indicate a detected leak based on the sensor cable being in contact with a liquid;
   a leak sensor cable carrier in physical communication with the sensor cable, the leak sensor cable carrier includes first and second tabs; and
   a plurality of cable carriers in physical communication with the sensor cable and with the leak sensor cable carrier, each of the cable carriers including:
      a support structure in physical communication with the first and second tabs of the leak sensor cable carrier, wherein the first and second tabs hold the support structure in physical communication with the leak sensor cable carrier when the support structure is at an engaged position, at a disengaged position, and when the support structure transitions between the engaged position and the disengaged position; and
      an absorbent material in physical communication with the support structure and with the sensor cable, the absorbent material to transfer the liquid from a portion of the absorbent material to the sensor cable.

2. The liquid cooling leak detection system of claim 1, further comprising: a location to receive a corresponding cold plate and a corresponding graphics processing unit.

3. The liquid cooling leak detection system of claim 2, wherein a first cable carrier of the plurality of cable carriers is placed on a first edge of the location, and a second cable carrier of the plurality of cable carriers is placed on a second edge of the location.

4. The liquid cooling leak detection system of claim 3, wherein the first and second edges of the location are opposite sides of the location.

5. The liquid cooling leak detection system of claim 1, wherein the support structure includes: a back, a base, a bump, and a bending tab, the bump and bending tab extend from the base.

6. The liquid cooling leak detection system of claim 5, wherein the leak sensor cable carrier includes an edge, and the bump is in physical communication with the edge when the support structure is in the engaged position.

7. The liquid cooling leak detection system of claim 6, wherein the bending tab is in physical communication with the edge when the support structure is in the disengaged position.

8. An information handling system comprising:
   a cooling pipe;
   a cold plate;
   a coupler to connect the cold plate and the cooling pipe;
   a cold plate fitting in physical communication with the coupler; and
   a liquid cooling leak detection system including:
      a sensor cable to indicate a detected leak when the sensor cable is in contact with a liquid;
      a leak sensor cable carrier in physical communication with the sensor cable, the leak sensor cable carrier includes first and second tabs; and a plurality of cable carriers in physical communication with the sensor cable and with the leak sensor cable carrier, a first cable carrier of the cable carriers including:

a support structure in physical communication with the first and second tabs of the leak sensor cable carrier, wherein the first and second tabs hold the support structure in physical communication with the leak sensor cable carrier when the support structure is at an engaged position, at a disengaged position, and when the support structure transitions between the engaged position and the disengaged position; and an absorbent material in physical communication with the support structure and with the sensor cable, the absorbent material located under the cold plate fitting when the support structure is in an engaged position, the absorbent material to transfer the liquid from a portion of the absorbent material to the sensor cable.

9. The information handling system of claim 8, wherein liquid cooling leak detection system further includes a location to receive the cold plate and a corresponding graphics processing unit.

10. The information handling system of claim 9, wherein the first cable carrier is placed on a first edge of the location, and a second cable carrier of the cable carriers is placed on a second edge of the location.

11. The information handling system of claim 10, wherein the first and second edges of the location are opposite sides of the location.

12. The information handling system of claim 8, wherein the support structure includes: a back, a base, a bump, and a bending tab, the bump and bending tab extend from the base.

13. The information handling system of claim 12, wherein the leak sensor cable carrier includes an edge, and the bump is in physical communication with the edge when the support structure is in the engaged position.

14. The information handling system of claim 13, wherein the bending tab is in physical communication with the edge when the support structure is in the disengaged position.

15. The information handling system of claim 12, wherein the absorbent material is past the cold plate fitting when the support structure is in the disengaged position.

16. A liquid cooling leak detection system comprising:
a sensor cable to indicate a detected leak when in contact with a liquid;
a leak sensor cable carrier in physical communication with the sensor cable, the leak sensor cable carrier including first and second tabs; and
a plurality of cable carriers in physical communication with the sensor cable and with the leak sensor cable carrier, each of the cable carriers including:
a support structure in physical communication with the first and second tabs of the leak sensor cable carrier, wherein the first and second tabs hold the support structure in physical communication with the leak sensor cable carrier when the support structure is at an engaged position, at a disengaged position, and when the support structure transitions between the engaged position and the disengaged position, the support structure includes a back, a base, a bump, and a bending tab, the bump and bending tab extending from the base,
wherein the support structure is held in physical communication with the leak sensor cable carrier via the first and second tabs; and
an absorbent material in physical communication with the support structure and with the sensor cable, the absorbent material to transfer the liquid from a portion of the absorbent material to the sensor cable.

17. The liquid cooling leak detection system of claim 16, wherein the leak sensor cable carrier includes an edge, and the bump is in physical communication with the edge when the support structure is in the engaged position.

18. The liquid cooling leak detection system of claim 17, wherein the bending tab is in physical communication with the edge when the support structure is in the disengaged position.

* * * * *